United States Patent
Ng et al.

(10) Patent No.: US 10,453,955 B2
(45) Date of Patent: *Oct. 22, 2019

(54) LATERAL DMOS DEVICE WITH DUMMY GATE

(71) Applicant: Taiwan Semiconductor Manufacturing Company, Ltd., Hsinchu (TW)

(72) Inventors: Chun-Wai Ng, Hsinchu (TW); Ruey-Hsin Liu, Hsinchu (TW); Jun Cai, Scarborough, ME (US); Hsueh-Liang Chou, Jhubei (TW); Chi-Chih Chen, Dounan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/869,261

(22) Filed: Jan. 12, 2018

(65) Prior Publication Data

US 2018/0138312 A1 May 17, 2018

Related U.S. Application Data

(63) Continuation of application No. 15/269,552, filed on Sep. 19, 2016, now Pat. No. 9,871,133, which is a continuation of application No. 13/351,295, filed on Jan. 17, 2012, now Pat. No. 9,450,056.

(51) Int. Cl.
*H01L 29/78* (2006.01)
*H01L 29/40* (2006.01)
*H01L 29/06* (2006.01)
*H01L 29/10* (2006.01)
*H01L 29/423* (2006.01)

(52) U.S. Cl.
CPC ...... *H01L 29/7816* (2013.01); *H01L 29/0649* (2013.01); *H01L 29/0696* (2013.01); *H01L 29/1095* (2013.01); *H01L 29/402* (2013.01); *H01L 29/42368* (2013.01)

(58) Field of Classification Search
None
See application file for complete search history.

(56) References Cited

U.S. PATENT DOCUMENTS

| | | | |
|---|---|---|---|
| 6,509,220 B2 * | 1/2003 | Disney | H01L 29/7825 438/197 |
| 7,824,968 B2 | 11/2010 | Chu et al. | |
| 9,450,056 B2 * | 9/2016 | Ng | H01L 29/402 |
| 9,871,133 B2 * | 1/2018 | Ng | H01L 29/402 |

(Continued)

*Primary Examiner* — Raj R Gupta
(74) *Attorney, Agent, or Firm* — Slater Matsil, LLP

(57) ABSTRACT

An LDMOS transistor with a dummy gate comprises an extended drift region over a substrate, a drain region in the extended drift region, a channel region in the extended drift region, a source region in the channel region, a first dielectric layer with a first thickness formed over the extended drift region, a second dielectric layer with a second thickness formed over the extended drift region and the channel region, wherein the first thickness is greater than the second thickness, and wherein the first dielectric layer and the second dielectric layer form two steps, a first gate formed over the first dielectric layer and a second gate formed above the second dielectric layer.

20 Claims, 3 Drawing Sheets

(56) References Cited

U.S. PATENT DOCUMENTS

2005/0064710 A1    3/2005  Chidambarrao et al.
2007/0069308 A1*   3/2007  Ko .................... H01L 29/402
                                                257/401
2011/0241113 A1*  10/2011  Zuniga ............... H01L 29/402
                                                257/343

* cited by examiner

LATERAL DMOS DEVICE WITH DUMMY GATE

This is a continuation application of U.S. application Ser. No. 15/269,552, entitled "Lateral DMOS Device with Dummy Gate" which was filed on Sep. 19, 2016, which is a continuation application of U.S. application Ser. No. 13/351,295, entitled "Lateral DMOS Device with Dummy Gate" which was filed on Jan. 17, 2012, now U.S. Pat. No. 9,450,056, and are incorporated herein by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are needed to maintain the electronic components' performance from one generation to the next. For example, low gate-to-drain capacitance and high breakdown voltage of transistors are desirable for high power applications.

As semiconductor technologies evolve, metal oxide semiconductor field effect transistors (MOSFET) have been widely used in today's integrated circuits. MOSFETs are voltage controlled device. When a control voltage is applied to the gate a MOSFET and the control voltage is greater than the threshold of the MOSFET, a conductive channel is built between the drain and the source of the MOSFET. As a result, a current flows between the drain and the source of the MOSFET. On the other hand, when the control voltage is less than the threshold of the MOSFET, the MOSFET is turned off accordingly.

MOSFETs may include two major categories. One is n-channel MOSFETs; the other is p-channel MOSFETs. According to the structure difference, MOSFETs can be further divided into three sub-categories, planar MOSFETs, lateral double diffused MOS (LDMOS) FETs and vertical double diffused MOSFETs. In comparison with other MOSFETs, the LDMOS is capable of delivering more current per unit area because its asymmetric structure provides a short channel between the drain and the source of the LDMOS.

In order to increase the breakdown voltage of the LDMOS, the gate poly-silicon of the LDMOS may be extended to make an overlap with the drift region of the LDMOS. Such an overlap functions as a field plate to maintain the breakdown voltage of the LDMOS.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a lateral double diffused metal oxide semiconductor (LDMOS) device with a dummy gate. The embodiments of the disclosure may also be applied, however, to a variety of metal oxide semiconductor field effect transistors (MOSFETs).

Figure 1:
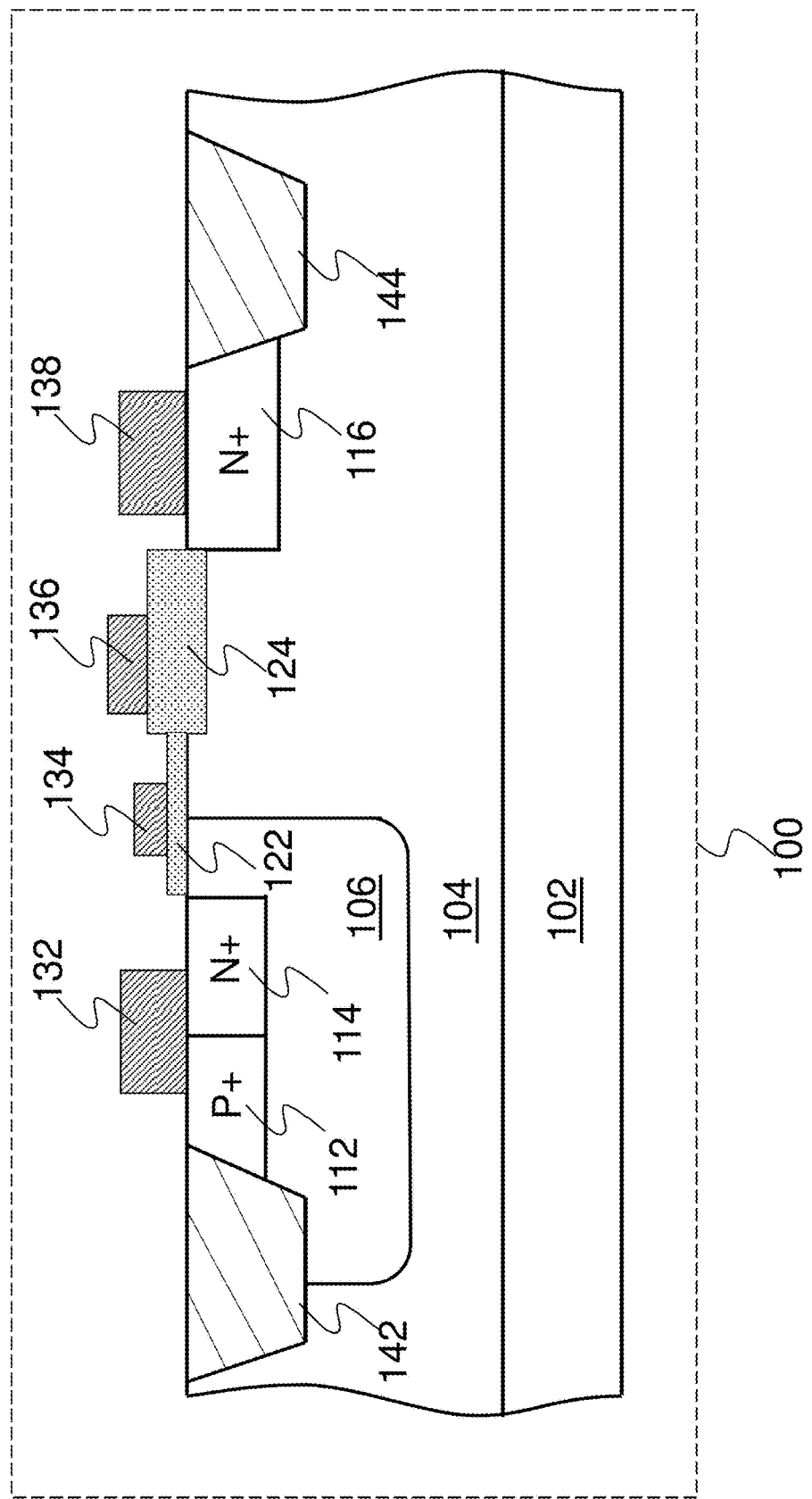
FIG. 1 illustrates a simplified cross-sectional view of a lateral DMOS transistor with a dummy gate in accordance with an embodiment.

FIG. 1 illustrates a simplified cross-sectional view of a lateral DMOS transistor with a dummy gate in accordance with an embodiment. The lateral DMOS transistor 100 includes a substrate 102, preferably P-type, an N-type region 104 formed over the substrate 102, a P-type region 106 and a first N+ region 116 formed over the N region 104. A P+ region 112 and a second N+ region 114 are formed in the P-type region 106. The lateral DMOS transistor 100 further comprises a gate dielectric layer 122 with a first thickness and a dielectric insulating layer 124 with a second thickness. An active gate 134 and a dummy gate 136 are formed on the gate dielectric layer 122 and the dielectric insulating layer 124 respectively.

The substrate 102 may be formed of silicon, silicon germanium, silicon carbide or the like. The N-type region 104 is formed over the substrate 102. In accordance with an embodiment, the N-type region 104 may be an epitaxial layer. The N-type region 104 may be doped with an n-type dopant such as phosphorous to a doping density of about $10^{15}/cm^3$ to $10^{18}/cm^3$. It should be noted that other n-type dopants such as arsenic, nitrogen, antimony, combination thereof, or the like, could alternatively be used. It should further be noted that the N-type region 104 of the LDMOS 100 may be alternatively referred to as an extended drift region.

The P-type region 106 is formed by implanting p-type doping materials such as boron, gallium, aluminum, indium, combinations thereof, or the like. In accordance with an embodiment, a p-type material such as boron may be implanted to a doping density of about $10^{15}/cm^3$ to $10^{18}/cm^3$. Alternatively, the P-type region 106 can be formed by a diffusion process. The P-type region 106 of the LDMOS 100 may be alternatively referred to as a channel region.

A first N+ region 116 is formed in the N-type region 104. In accordance with an embodiment, the first N+ region 116 functions as a drain of the LDMOS 100. The drain region may be formed by implanting an n-type dopant such as phosphorous at a concentration of between about $10^{19}/cm^3$ and about $10^{20}/cm^3$. Furthermore, a drain contact 138 is formed over the first N+ region 116.

A second N+ region 114 is formed in the P-type region 106. In accordance with an embodiment, the second N+ region 114 may be a source of the LDMOS 100. The source region may be formed by implanting an n-type dopant such as phosphorous at a concentration of between about $10^{19}/cm^3$ and about $10^{20}/cm^3$. As shown in FIG. 1, the source region is formed adjacent to the active gate 134 on the opposite side from the drain (the first N+ region 116).

A P+ region 112 is formed adjacent to the second N+ region 114 in the P-type region 106. The P+ region may be formed by implanting a p-type dopant such as boron at a concentration of between about $10^{19}/cm^3$ and about $10^{20}/cm^3$. The P+ region 112 may contact the p-type body. In order to eliminate the body effect, the P+ region 112 may be coupled to the source 114 directly through the source contact 132.

A gate dielectric layer 122 is formed over the N-type region 104. The gate dielectric layer 122 may be formed of silicon oxide, silicon oxynitride, hafnium oxide, zirconium oxide or the like. As shown in FIG. 1, the gate dielectric layer 122 is partially on top of the P-type region 106. In accordance with an embodiment, the gate dielectric layer 122 is of a thickness of between about 100 Å and about 200 Å. An active gate 134 is formed on the gate dielectric layer 122. The active gate 134 may be formed of polysilicon, polysilicon germanium, nickel silicide or other metal, metal alloy materials.

The dielectric insulating layer 124 is on top of the N-type region 104. More particularly, the dielectric insulating layer 124 is located between the active gate 134 and the drain 116. In accordance with an embodiment, the dielectric insulating layer 124 is of a thickness of between about 500 Å and about 2000 Å. A dummy gate 136 is formed on top of the dielectric insulating layer 124. It should be noted that the dummy gate 136 may be formed in the same process step as the active gate 134. More particularly, the dummy gate 136 and the active gate 134 may be formed as a large single gate first. In order to reduce the gate to drain charge, a middle portion of such a large single gate may be removed by using suitable etching techniques such as dry etching. As a result, the remaining portions of the large single gate become the active gate 134 and the dummy gate 136 respectively.

The dummy gate 136 functions as a field plate, which helps to maintain the breakdown voltage of the LDMOS 100. In addition, by separating the dummy gate 136 from the active gate 134, the overlap between the gate region and drain region is reduced accordingly. Such a small overlap between gate region and drain region helps to reduce the gate-to-drain charge of the LDMOS 100. Furthermore, the dummy gate 136 may be biased by a voltage source. For example, when the LDMOS 100 is a 20V transistor, the bias voltage coupled to the dummy gate 136 may be up to 20V. Such a bias voltage helps to reduce the on resistance of the LDMOS 100.

The first isolation region 142 and the second isolation region 144 are used to isolate active regions so as to prevent leakage current from flowing between adjacent active regions. The isolation region (e.g., 142) can be formed by various ways (e.g., thermally grown, deposited) and materials (e.g., silicon oxide, silicon nitride). In this embodiment, the first isolation region 142 and the second isolation region 144 may be fabricated by a shallow trench isolation (STI) technique.

Figure 2:
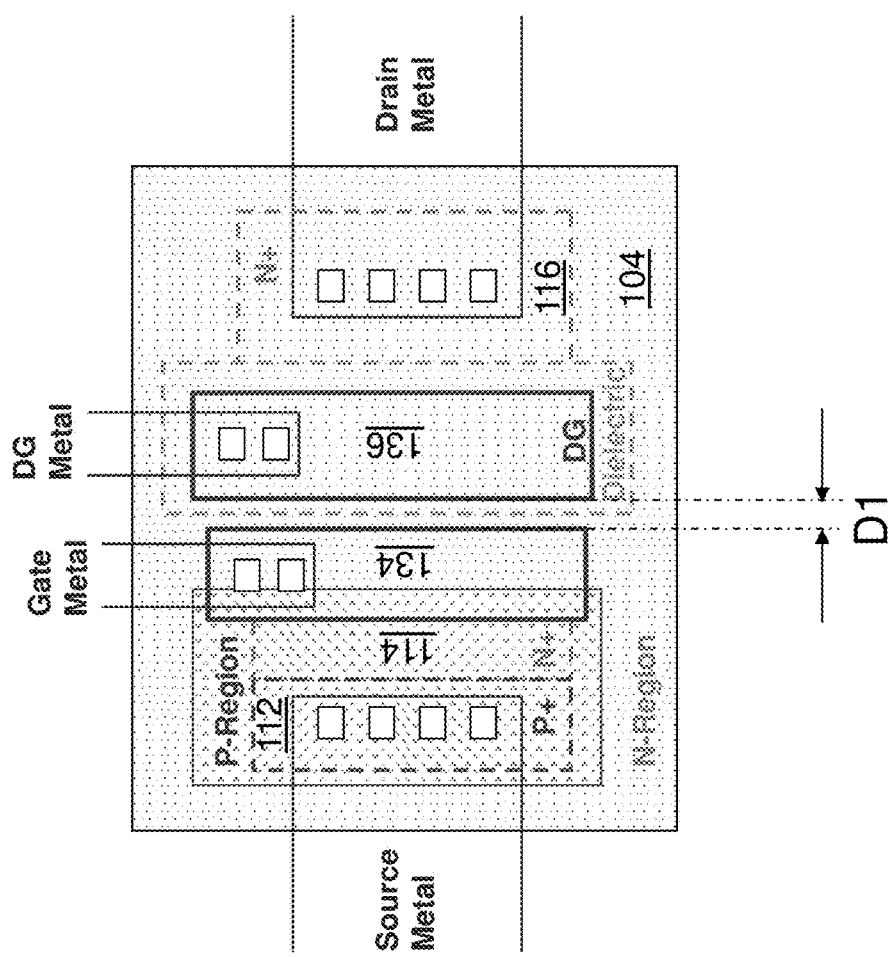
FIG. 2 illustrates a simplified top view of a lateral DMOS transistor with a dummy gate in accordance with an embodiment.

FIG. 2 illustrates a simplified top view of a lateral DMOS transistor with a dummy gate in accordance with an embodiment. In FIG. 2, the N-type region 104, the first N+ region 116, the second N+ region 114, the P+ region 112, the active gate 134 and the dummy gate 136 are shown. In addition, dimensions of the LDMOS transistor 100 are shown. In particular, the distance between the active gate 134 and the dummy gate 136 is illustrated. In accordance with an embodiment, the distance D1 is a range from 0.1 um to 1 um.

One skilled in the art will recognize that FIG. 1 illustrates an ideal profile as doped. The distance D1 may vary after subsequent diffusion processes. The distance D1 shown in FIG. 2 is used to illustrate the inventive aspects of the various embodiments. The present invention is not limited to any particular distance between the active gate 134 and the dummy gate 136.

Figure 3:
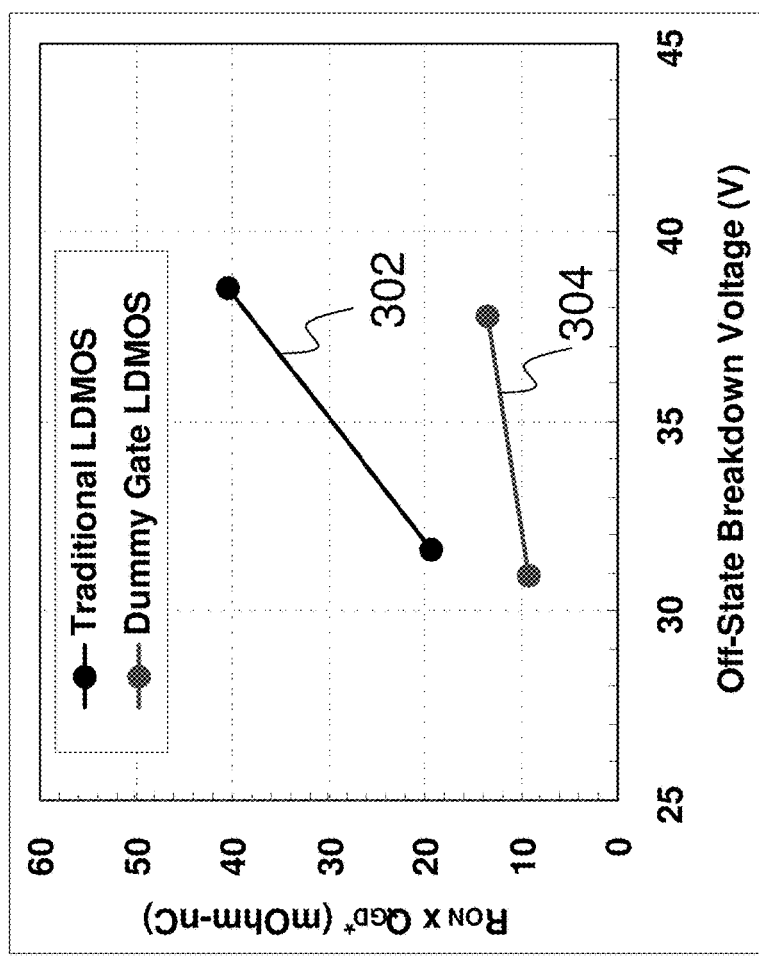
FIG. 3 illustrates two curves illustrating the performance difference between a traditional LDMOS transistor without a dummy gate and a LDMOS transistor with a dummy gate in accordance with an embodiment.

FIG. 3 illustrates two curves illustrating the performance difference between a traditional LDMOS transistor without a dummy gate and LDMOS transistor with a dummy gate. The horizontal axis of FIG. 3 represents the breakdown voltage across an LDMOS transistor. The vertical axis of FIG. 3 represents a performance index of the LDMOS transistor. More particularly, the performance index is the produce of On-resistance ($R_{ON}$) and gate-to-drain charge ($Q_{GD}$). In accordance with an embodiment, the conduction losses of an LDMOS transistor may be proportional to the on resistance of the LDMOS transistor. On the other hand, the switching losses of the LDMOS transistor may be proportional to the gate-to-drain charge of the LDMOS transistor. In order to achieve an efficient LDMOS transistor, a low $R_{ON} \times Q_{GD}$ is desirable for reducing conduction losses as well as switching losses.

A curve 302 and a curve 304 illustrate the $R_{ON} \times Q_{GD}$ difference between a traditional LDMOS transistor without a dummy gate and LDMOS transistor with a dummy gate. As shown in FIG. 3, at the same breakdown voltage level, an LDMOS transistor with a dummy gate is of a low $R_{ON} \times Q_{GD}$. For example, when the dummy gate LDMOS transistor has a 31V breakdown voltage, the corresponding $R_{ON} \times Q_{GD}$ is about 10 mOhm-nC. By contrast, with the same breakdown voltage level, the LDMOS transistor without a dummy gate has a higher $R_{ON} \times Q_{GD}$. As illustrated by curve 302, the $R_{ON} \times Q_{GD}$ of the traditional LDMOS transistor is about 20 mOhm-nC.

FIG. 3 shows an LDMOS transistor having a dummy gate may achieve a higher breakdown voltage without sacrificing its $R_{ON} \times Q_{GD}$. As such, an advantageous feature of this embodiment is that a dummy gate helps to maintain the breakdown voltage of an LDMOS transistor. In addition, the dummy gate can reduce the gate charge of the LDMOS transistor so that the switching losses of the LDMOS transistor may be reduced.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit device comprising:
a source region having a first conductivity type;
a drain region having the first conductivity type;
an interposed region between the source region and the drain region;
a first gate dielectric over the interposed region;
an active gate over the first gate dielectric, an entirety of the active gate being on the first gate dielectric;
a second gate dielectric over the interposed region, the second gate dielectric being in direct contact with the first gate dielectric such that an upper surface of the first gate dielectric and an upper surface of the second gate dielectric form a step, wherein the second gate dielectric is thicker than the first gate dielectric, wherein a lower surface of the first gate dielectric is not planar with a lower surface of the second gate dielectric; and
a dummy gate over the second gate dielectric, wherein the dummy gate is interposed between the active gate and the drain region, an entirety of the dummy gate being on the second gate dielectric, wherein the step is free of the active gate and the dummy gate.

2. The integrated circuit device of claim 1, further comprising a first well region, wherein the drain region has an interface with the first well region, the first well region having the first conductivity type.

3. The integrated circuit device of claim 2, further comprising a second well region within the first well region, wherein the source region has an interface with the second well region, the second well region having a second conductivity type.

4. The integrated circuit device of claim 3, wherein the active gate overlaps an interface between the first well region and the second well region.

5. The integrated circuit device of claim 2, wherein the dummy gate is over the first well region.

6. The integrated circuit device of claim 5, wherein a bottom surface of the second gate dielectric contacts the first well region.

7. The integrated circuit device of claim 1, further comprising a doped region having a second conductivity type, the source region being interposed between doped region and the active gate.

8. The integrated circuit device of claim 7, further comprising a contact extending over an interface between the doped region and the source region.

9. An integrated circuit device comprising:
a source region having a first conductivity type;
a drain region having the first conductivity type;
a first doped region having a second conductivity type, the first doped region being interposed between the source region and the drain region;
a drift region having the first conductivity type, the drift region being interposed between the first doped region and the drain region;
a first gate dielectric over the first doped region;
an active gate over the first gate dielectric, an entirety of the first gate dielectric under the active gate having a first uniform thickness;
a second gate dielectric over the drift region, wherein the second gate dielectric is thicker than the first gate dielectric, wherein a step is formed at an interface between the first gate dielectric and the second gate dielectric; and
a dummy gate over the second gate dielectric, an entirety of the second gate dielectric under the dummy gate having a second uniform thickness, wherein the step is free of the active gate and the dummy gate.

10. The integrated circuit device of claim 9, wherein the drift region extends below the source region.

11. The integrated circuit device of claim 10, further comprising a second doped region having the second conductivity type, the second doped region having a higher concentration of P-type dopants that the first doped region, the source region being interposed between the first doped region and the second doped region.

12. The integrated circuit device of claim 11, wherein an entire bottom surface of the second doped region and an entire bottom surface of the source region contact the first doped region.

13. The integrated circuit device of claim 9, wherein a horizontal distance between the active gate and the dummy gate is in a range from 0.1 um to 1 um.

14. The integrated circuit device of claim 9, wherein a thickness of the first gate dielectric is between about 100 Å and about 200 Å.

15. The integrated circuit device of claim 14, wherein a thickness of the second gate dielectric is between about 500 Å and about 1000 Å.

16. A transistor comprising:
an extended drift region having a first conductivity type;
a drain region above the extended drift region, wherein the drain region has the first conductivity type;
a source region above the extended drift region, the source region having the first conductivity type;
a doped region interposed between the source region and the extended drift region, the doped region having a second conductivity type;
a first dielectric layer with a first thickness over the extended drift region;
a second dielectric layer with a second thickness over the extended drift region, wherein an upper surface of the first dielectric layer and an upper surface of the second dielectric layer form a step;
an active gate on the first dielectric layer, an entirety of the active gate being on the first dielectric layer; and
a dummy gate on the second dielectric layer, wherein the active gate is spaced apart from the dummy gate and the step, wherein an entirety of the dummy gate being on the second dielectric layer, and wherein the dummy gate is spaced apart from the step.

17. The transistor of claim 16, further comprising a body contact region, the body contact region having the second conductivity type.

18. The transistor of claim 17, further comprising a contact overlapping the source region and the body contact region.

19. The transistor of claim 16, wherein the first dielectric layer overlaps the extended drift region and the doped region.

20. The transistor of claim 19, wherein the active gate overlaps the extended drift region and the doped region.

* * * * *